(12) United States Patent
Yao et al.

(10) Patent No.: US 12,495,512 B2
(45) Date of Patent: Dec. 9, 2025

(54) RETAINING DEVICE FOR MOUNTING A SLIDE RAIL TO A SERVER RACK

(71) Applicant: FOSITEK CORPORATION, New Taipei (TW)

(72) Inventors: Hsu-Hong Yao, New Taipei (TW); Mo-Yu Zhang, New Taipei (TW); Hsuan-Po Huang, New Taipei (TW)

(73) Assignee: FOSITEK CORPORATION, New Taipei (TW)

( * ) Notice: Subject to any disclaimer, the term of this patent is extended or adjusted under 35 U.S.C. 154(b) by 17 days.

(21) Appl. No.: 18/748,495

(22) Filed: Jun. 20, 2024

(65) Prior Publication Data

US 2025/0324538 A1   Oct. 16, 2025

(30) Foreign Application Priority Data

Apr. 10, 2024  (TW) .................................. 113113349

(51) Int. Cl.
   *H05K 7/14*   (2006.01)
(52) U.S. Cl.
   CPC .................................. *H05K 7/1489* (2013.01)
(58) Field of Classification Search
   CPC ....... H05K 7/1489; H05K 7/183; A47B 88/46
   See application file for complete search history.

(56) References Cited

U.S. PATENT DOCUMENTS

| | | | |
|---|---|---|---|
| 7,040,725 B1* | 5/2006 | Mao-Chin ............ | A47B 88/467 312/334.44 |
| 7,472,973 B2* | 1/2009 | Huang .................. | A47B 88/467 312/319.1 |
| 8,894,164 B2* | 11/2014 | Zimmer ............... | A47B 88/467 312/334.1 |
| 9,545,152 B2* | 1/2017 | Egger ................... | A47B 88/463 |
| 10,653,240 B2* | 5/2020 | Goetz .................... | A47B 88/46 |
| 10,758,043 B2* | 9/2020 | Pohlmann ............ | A47B 88/467 |
| 11,259,632 B2* | 3/2022 | Chen .................... | A47B 88/473 |
| 2004/0239218 A1* | 12/2004 | Jurja ..................... | A47B 88/467 312/333 |
| 2007/0132346 A1* | 6/2007 | Huang .................. | A47B 88/467 312/333 |
| 2013/0182978 A1* | 7/2013 | Huang .................. | A47B 88/467 384/21 |
| 2015/0366345 A1* | 12/2015 | Chen .................... | A47B 88/467 312/319.1 |
| 2016/0076288 A1* | 3/2016 | Bantle ................... | A47B 88/46 49/417 |

(Continued)

*Primary Examiner* — Ko H Chan
(74) *Attorney, Agent, or Firm* — Burris Law, PLLC (57) ABSTRACT

A retaining device for mounting a slide rail to a server rack between front and rear ends of the server rack includes a rear support unit connected with the rear end, and a front support unit connected with the slide rail. The rear support unit includes a rear support rail and a biasing member. The front support unit includes a front support rail telescopically disposed on the rear support rail, and a front bracket connectable with the front end and the slide rail. The front support rail has a thrust block abutting against the biasing member. The front support rail is moved rearwardly to move the slide rail and the front bracket toward the rear support rail so as to vary a distance between the front bracket and the rear end, and the thrust block compresses the biasing member to tightly connect the front bracket with the front end.

7 Claims, 7 Drawing Sheets

(56) References Cited

U.S. PATENT DOCUMENTS

| | | | |
|---|---|---|---|
| 2018/0132615 A1* | 5/2018 | Kim | F16C 29/02 |
| 2019/0008276 A1* | 1/2019 | Goetz | A47B 88/467 |
| 2021/0169221 A1* | 6/2021 | Lee | A47B 88/931 |
| 2022/0095793 A1* | 3/2022 | Chen | A47B 88/49 |
| 2023/0031822 A1* | 2/2023 | Lin | H05K 5/0221 |
| 2023/0107056 A1* | 4/2023 | Chen | F16M 13/02 |
| | | | 248/298.1 |

* cited by examiner

RETAINING DEVICE FOR MOUNTING A SLIDE RAIL TO A SERVER RACK

CROSS-REFERENCE TO RELATED APPLICATION

This application claims priority to Taiwanese Patent Application No. 113113349, filed on Apr. 10, 2024, and incorporated by reference herein in its entirety.

FIELD

The disclosure relates to a retaining device for a slide rail, and more particularly to a retaining device for mounting a slide rail to a server rack.

BACKGROUND

A conventional slide rail retaining device is mounted on a server rack for a slide rail to be mounted thereon so as to install the slide rail on the server rack. However, a conventional slide rail retaining device has a fixed length which is incompatible with a variety of server racks having different dimensions.

SUMMARY

Therefore, an object of the disclosure is to provide a retaining device that can alleviate at least one of the drawbacks of the prior art.

According to the disclosure, the retaining device for mounting a slide rail to a server rack between front and rear ends of the server rack includes a rear support unit and a front support unit. The rear support unit is connectable with the rear end of the server rack. The rear support unit includes a rear support rail, a mounting seat disposed on the rear support rail, and a biasing member disposed on the mounting seat. The front support unit includes a front support rail which is telescopically disposed on the rear support rail for the slide rail to be securely mounted thereon, and a front bracket which is connectable with both the front end of the server rack and one end of the slide rail. The front support rail has a mating surface which faces the mounting seat, and a thrust block which is formed on the mating surface to abut against the biasing member. The front support rail is moved rearwardly relative to the rear support rail to bring the slide rail and the front bracket into movement toward the rear support rail so as to vary a distance between the front bracket and the rear end of the server rack, and to bring the thrust block to compress the biasing member such that the biasing member urges the front support rail to tightly connect the front bracket with the front end of the server rack with a biasing returning force.

With the front support rail movably and telescopically disposed on the rear support rail, the slide rail and the front bracket are brought to move rearwardly toward the rear support rail to vary a distance between the front bracket and the rear end of the server rack so as to adjust the length of the retaining device for appropriately mounting a variety of server racks having different dimensions. Also, with the biasing member urging the front support rail with a biasing returning force, the front bracket is tightly connected with the front end of the server rack so as to firmly connect the retaining device with the server rack.

BRIEF DESCRIPTION OF THE DRAWINGS

Other features and advantages of the disclosure will become apparent in the following detailed description of the embodiment with reference to the accompanying drawings. It is noted that various features may not be drawn to scale.

DETAILED DESCRIPTION

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 1:
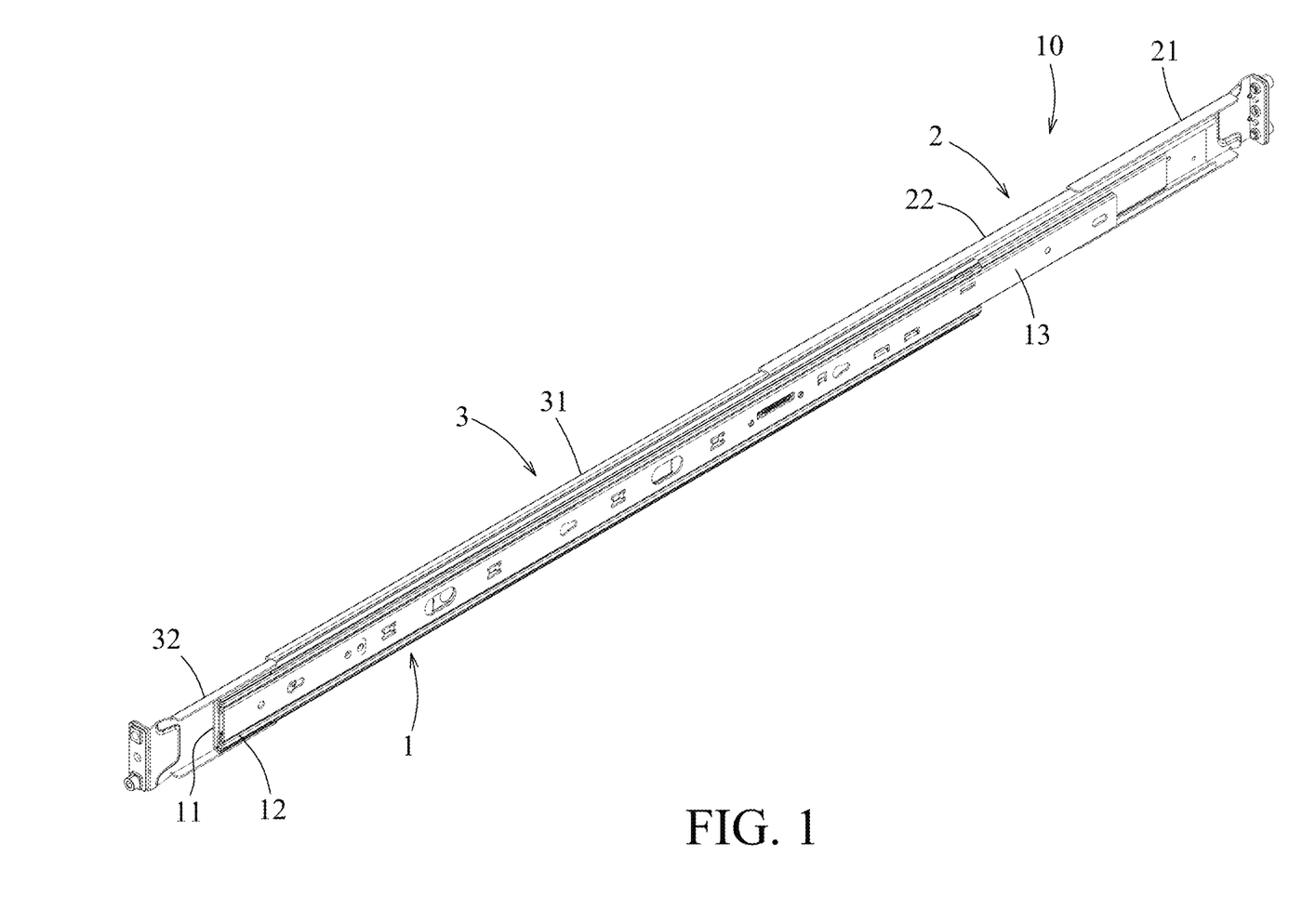
FIG. 1 is a perspective view illustrating an embodiment of a retaining device and a slide rail according to the disclosure.
Figure 2:
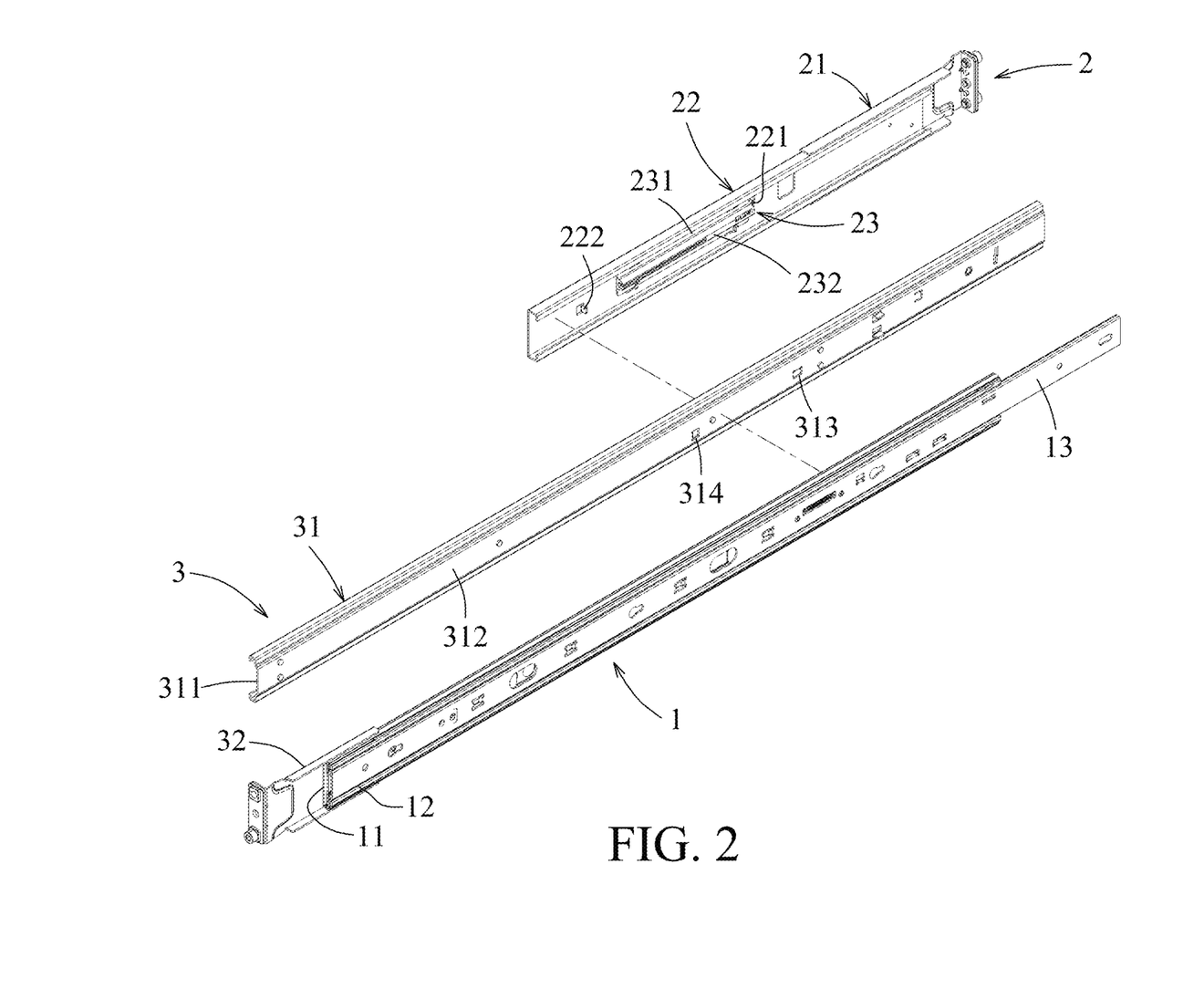
FIG. 2 is an exploded perspective view of the embodiment.

Referring to FIGS. 1 and 2, an embodiment of a retaining device 10 according to the disclosure is adapted for mounting a three-section slide rail 1 to a server rack (not shown) between front and rear ends of the server rack. The slide rail 1 includes an outer section 11, a middle section 12 slidably disposed on the outer section 11, and an inner section 13 slidably disposed on the middle section 12. The outer section 11 is securely mounted to the server rack through the retaining device 10. The inner section 13 is connected with a lateral side of a server case (not shown). The retaining device 10 is of a telescopic form, and includes a rear support unit 2 and a front support unit 3.

Figure 3:
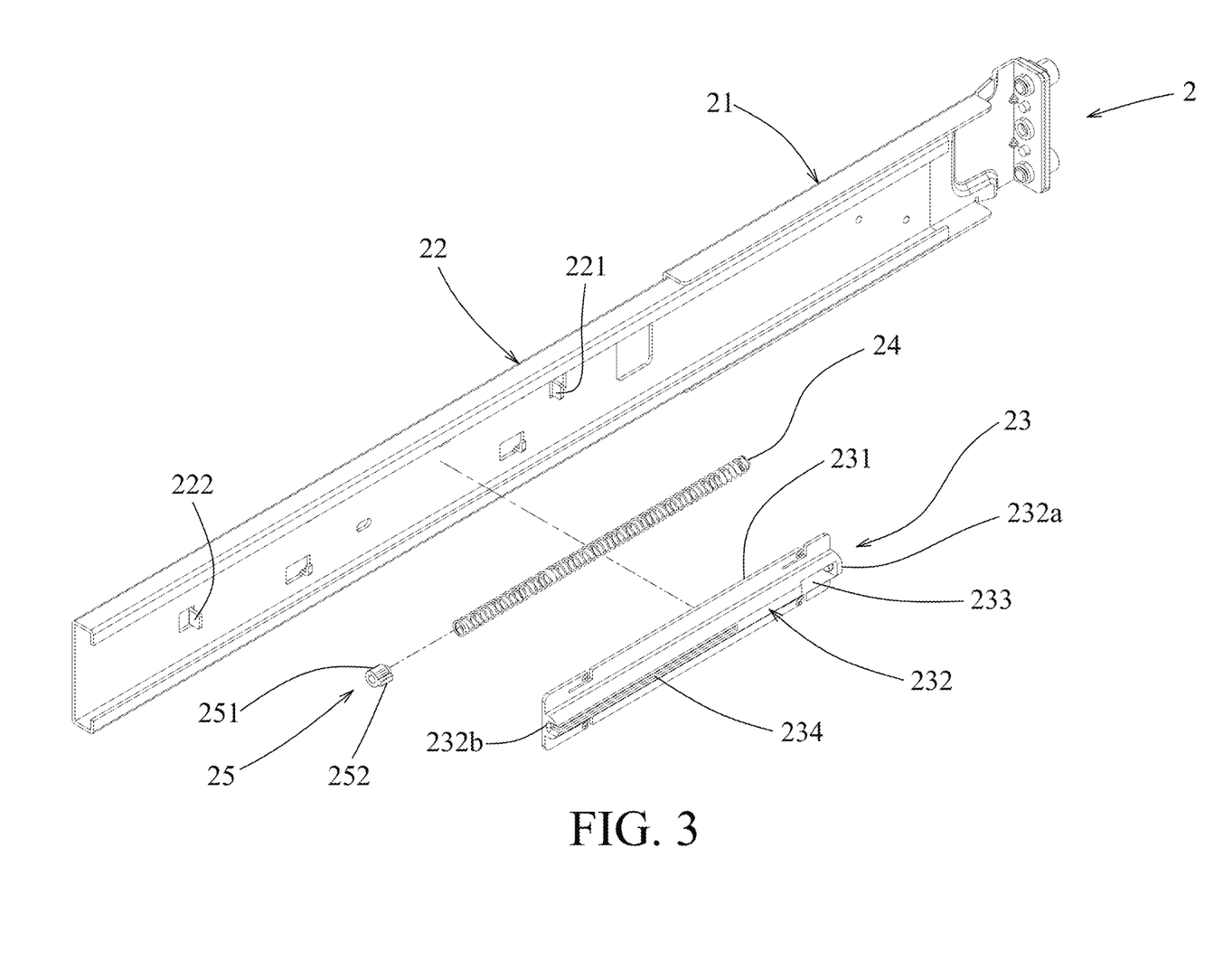
FIG. 3 is an exploded perspective view of a rear support unit of the embodiment.
Figure 4:
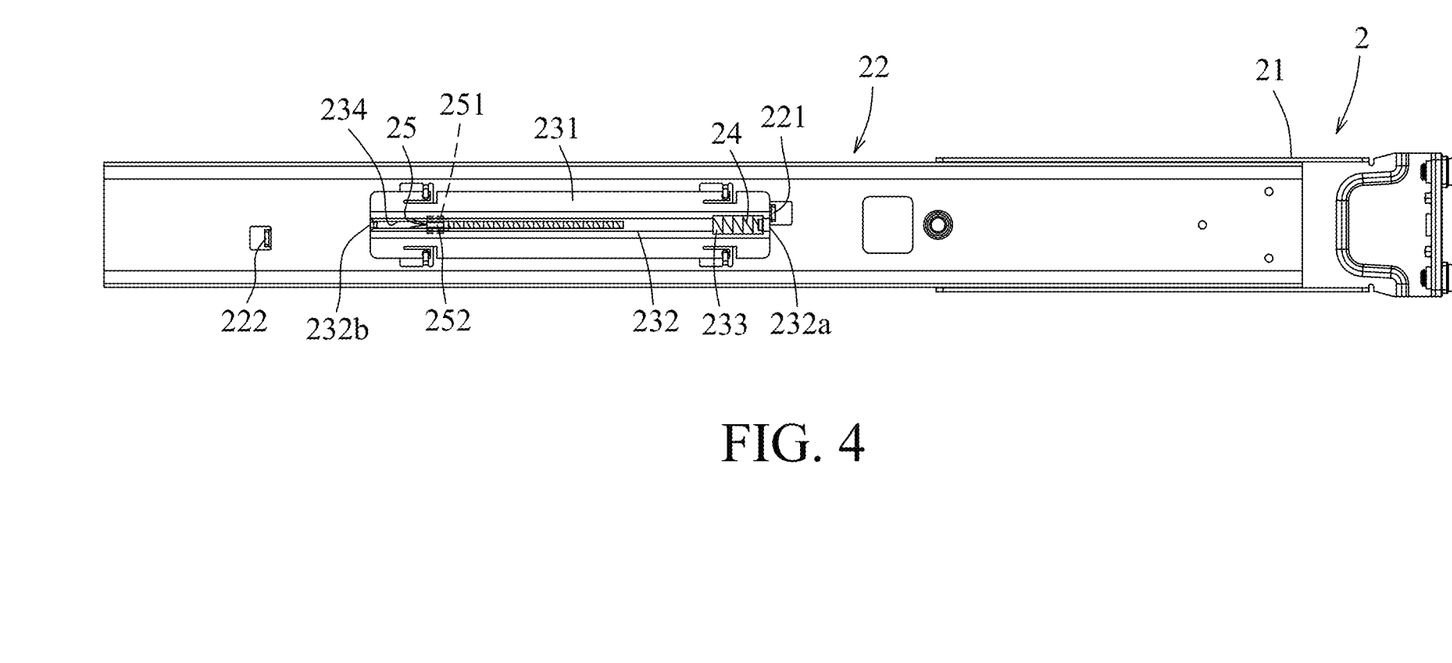
FIG. 4 is a side view of the rear support unit of the embodiment.

With reference to FIGS. 2 to 4, the rear support unit 2 is connectable with the rear end of the server rack, and includes a rear bracket 21 connected with the rear end of the server rack, a rear support rail 22 securely connected with the rear bracket 21, a mounting seat 23 disposed on the rear support rail 22, a biasing member 24 disposed on the mounting seat 23, and an abutment member 25 movably disposed on the mounting seat 23. The rear support rail 22 is formed with a first stopper 221 and a second stopper 222 spaced apart from the first stopper 221. The mounting seat 23 has a flat plate portion 231 securely disposed on the rear support rail 22, and a protrusion portion 232 extending from the flat plate portion 231. The protrusion portion 232 defines the receiving slot 233 for receiving the biasing member 24 therein, and extends along the rear support rail 22 to have a first end (232a) proximal to the rear end of the server rack for abutting engagement of an end of the biasing member 24, and a second end (232b) opposite to the first end (232a). The mounting seat 23 further has a guide slot 234 which extends from the second end (232b) of the protrusion portion 232 toward the first end (232a) and is in communication with the receiving slot 233. The first stopper 221 formed on the rear support rail 21 retains and prevents rearward movement of the mounting seat 23 toward the rear end of the server rack. In this embodiment, the biasing member is in the form of a compression spring. The abutment member 25 is movably disposed in the receiving slot 233 for abutting engagement of an opposite end of the biasing member 24. Specifically, the abutment member 25 includes an abutment body 251 which is disposed in the receiving slot 233 and is in abutting engagement with the opposite end of the biasing member 24, and a tab portion 252 which projects from the abutment body 251 to be movably disposed in the guide slot 234. In assembling of the biasing member 24, one end of the biasing member 24 abuts against the first end (232a) of the protrusion portion 232, and the abutment member 25 is mounted in the receiving slot 233 and the guide slot 234 to be in abutting engagement with the other end of the biasing member 24. The assembling operation is convenient to conduct. The mounting seat 23 covers the biasing member 24 to protect, guide and prevent removal of the biasing member 24.

Figure 5:
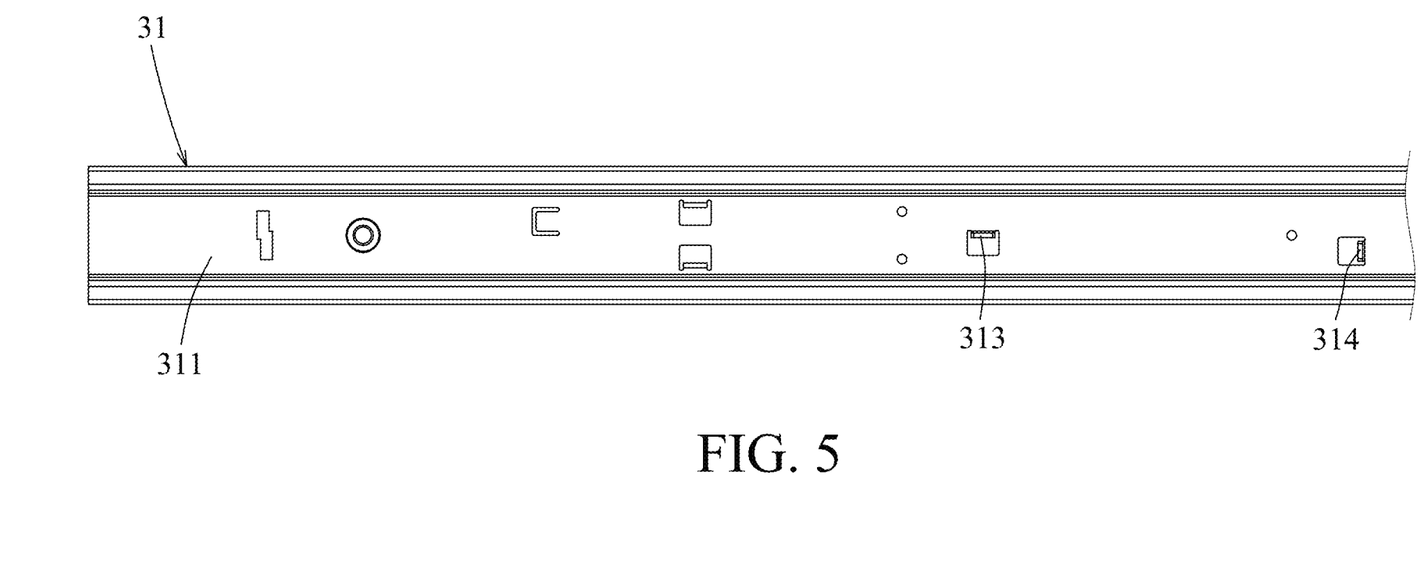
FIG. 5 is a fragmentary side view of a front support unit of the embodiment.

With reference to FIGS. 2, 3 and 5, the front support unit 3 includes a front support rail 31 which is telescopically disposed on the rear support rail 22 for the slide rail 1 to be securely mounted thereon, and a front bracket 32 which is connectable with both the front end of the server rack and one end of the slide rail 1. The front support rail 31 having a mating surface 311 which faces the mounting seat 23, a mounting surface 312 opposite to the mating surface 311, a thrust block 313 which is formed on the mating surface 311 to abut against the biasing member 24, and a limiting block 314 which is formed on the mating surface 311 and spaced apart from the thrust block 313. The thrust block 313 is in abutting engagement with the tab portion 252 of the abutment member 25.

Figure 6:
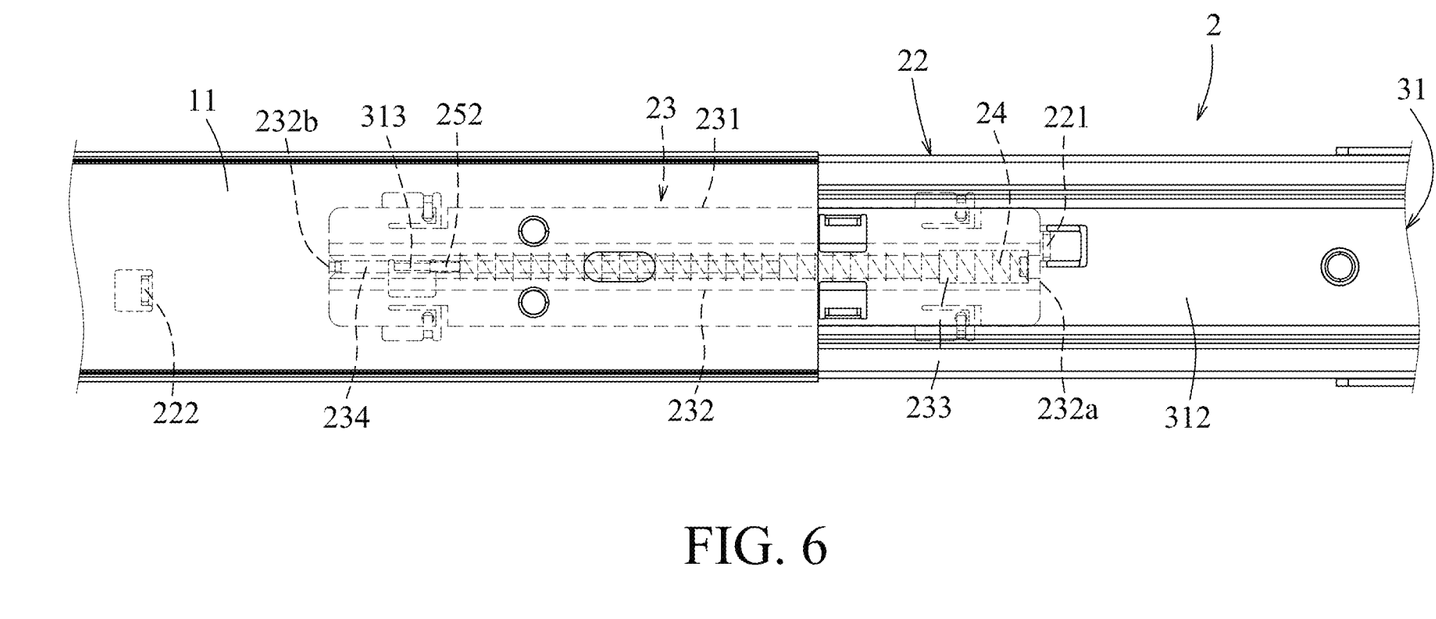
FIG. 6 is a fragmentary side view of the embodiment, illustrating a biasing member is in a non-compressed state.
Figure 7:
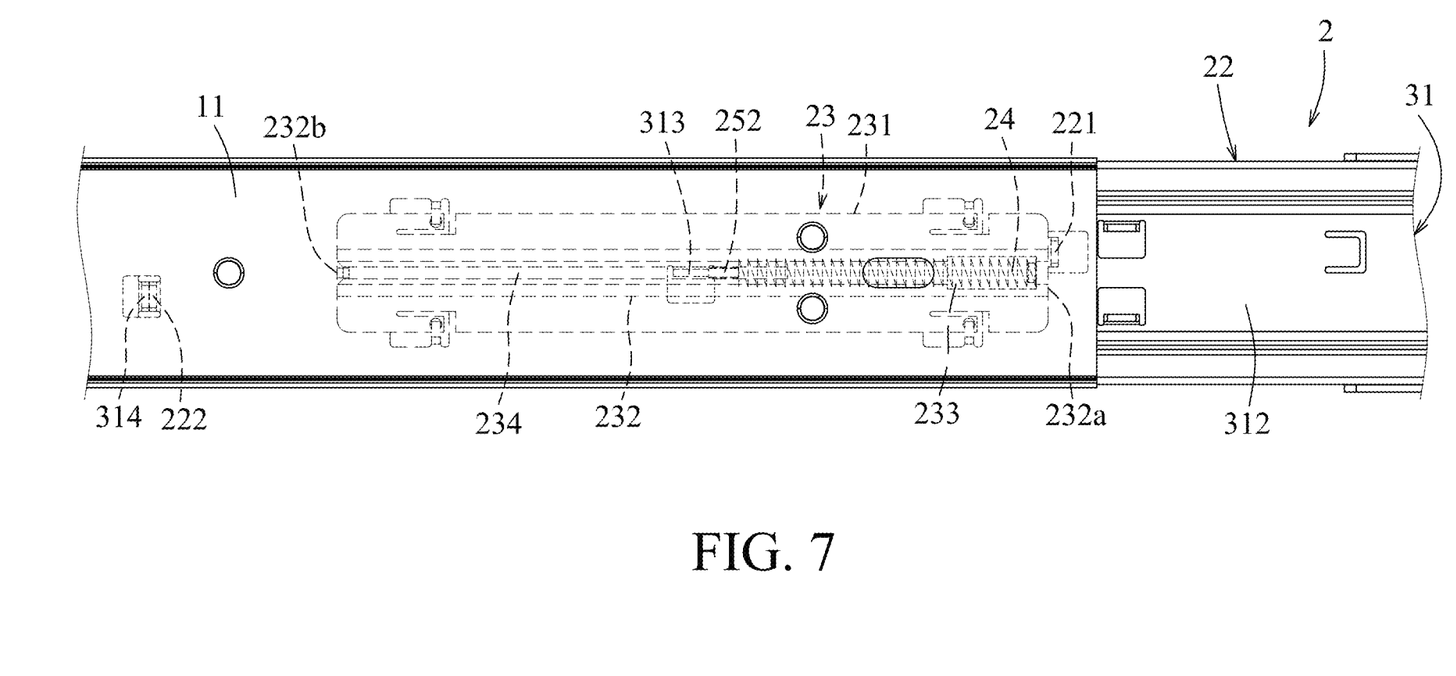
FIG. 7 is a fragmentary side view of the embodiment, illustrating the biasing member is in a compressed state.

With reference to FIGS. 2, 6 and 7, the front support rail 31 is moved rearwardly relative to the rear support rail 22 to bring the slide rail 1 and the front bracket 32 into movement toward the rear support rail 22 so as to vary a distance between the front bracket 32 and the rear bracket 21 (i.e., the rear end of the server rack) to adjust the length of the retaining device 10 for appropriately mounting a variety of server racks (not shown) having different dimensions. During the movement of the front support rail 31, the second stopper 222 retains the limiting block 314 to prevent further rearward movement of the front support rail 31 relative to the rear support rail 22, as shown in FIG. 7. Also, the thrust block 313 that is abuttingly engaged with the tab portion 252 is brought to compress the biasing member 24 through the abutment body 251 such that the biasing member 24 urges the front support rail 31, the outer section 11 of the slide rail 1 and the front bracket 32 to tightly connect the front bracket 32 with the front end of the server rack with a biasing returning force so as to firmly connect the retaining device 10 with the server rack.

As illustrated, with the front support rail 31 movably and telescopically disposed on the rear support rail 22, the slide rail 1 and the front bracket 32 are brought to move rearwardly toward the rear support rail 22 to vary a distance between the front bracket 32 and the rear end of the server rack so as to adjust the length of the retaining device 10 for appropriately mounting a variety of server racks having different dimensions. Also, with the biasing member 24 urging the front support rail 31 with a biasing returning force, the front bracket 32 is tightly connected with the front end of the server rack so as to firmly connect the retaining device 10 with the server rack.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A retaining device for mounting a slide rail to a server rack between front and rear ends of the server rack, comprising:
   a rear support unit connectable with the rear end of the server rack, said rear support unit including a rear support rail, a mounting seat disposed on said rear support rail, and a biasing member disposed on said mounting seat; and
   a front support unit including a front support rail which is telescopically disposed on said rear support rail for the slide rail to be securely mounted thereon, and a front bracket which is connectable with both the front end of the server rack and one end of the slide rail, said front support rail having a mating surface which faces said mounting seat, and a thrust block which is formed on said mating surface to abut against said biasing member, said front support rail being moved rearwardly relative to said rear support rail to bring the slide rail and said front bracket into movement toward said rear support rail so as to vary a distance between said front bracket and the rear end of the server rack, and to bring said thrust block to compress said biasing member such that said biasing member urges said front support rail to tightly connect said front bracket with the front end of the server rack with a biasing returning force.

2. The retaining device of claim 1, wherein said biasing member is in form of a compression spring, and said mounting seat has a receiving slot for receiving said biasing member therein.

3. The retaining device of claim 2, wherein said mounting seat has a flat plate portion disposed on said rear support rail, and a protrusion portion extending from said flat plate portion, said protrusion portion defining said receiving slot and extending along said rear support rail to have a first end proximal to the rear end of the server rack for abutting engagement of an end of said biasing member, and a second end opposite to said first end.

4. The retaining device of claim 3, wherein said rear support unit further includes an abutment member which is movably disposed in said receiving slot for abutting engagement of an opposite end of said biasing member, said thrust block being moved to compress said biasing member through abutting engagement with said abutment member.

5. The retaining device of claim 4, wherein said mounting seat has a guide slot which extends from said second end of said protrusion portion toward said first end and in communication with said receiving slot, said abutment member including an abutment body which is disposed in said receiving slot and in abutting engagement with said opposite end of said biasing member, and a tab portion which projects from said abutment body to be movably disposed in said guide slot, said thrust block being abuttingly engaged with said tab portion to bring said abutment body to abuttingly compress said biasing member.

6. The retaining device of claim 1, wherein said front support unit is formed with a limiting block, said rear support rail being formed with a first stopper to retain and prevent rearward movement of said mounting seat toward the rear end of the server rack, and a second stopper which is spaced apart from said first stopper to retain said limiting block so as to prevent further rearward movement of said front support rail relative to said rear support rail.

7. The retaining device of claim 1, wherein said rear support unit further includes a rear bracket which is securely connected with said rear support rail and connectable with the rear end of the server rack.

* * * * *